United States Patent [19]

Marshall et al.

[11] Patent Number: 5,251,216
[45] Date of Patent: Oct. 5, 1993

[54] RECEIVER GAIN CONTROL FOR RADIO TELEPHONE SYSTEM

[75] Inventors: Keith Marshall; Robert O. Bristow, both of Basingstoke; Andrew P. Cheer, Hartley Wintney, all of England

[73] Assignee: Orbitel Mobile Communications Limited, Bracknell, England

[21] Appl. No.: 543,470

[22] Filed: Jun. 26, 1990

[30] Foreign Application Priority Data

Jul. 1, 1989 [GB] United Kingdom ............... 8915172

[51] Int. Cl.$^5$ .......................... H02K 47/04; H04J 3/00
[52] U.S. Cl. ............................... 370/95.3; 455/239.1; 379/58; 375/98; 370/113
[58] Field of Search ............... 370/77, 113, 13, 95.1, 370/95.3, 104.1; 375/98; 379/58, 59, 60, 63; 455/33, 54, 56, 239, 240, 245, 246, 247, 249, 250, 251; 340/825.06, 825.15, 825.44

[56] References Cited

U.S. PATENT DOCUMENTS

| | | | |
|---|---|---|---|
| 4,330,859 | 5/1982 | Takada | 370/77 |
| 4,577,310 | 3/1986 | Korsky et al. | 370/67 |
| 4,635,103 | 1/1987 | Steckler et al. | 358/27 |
| 4,656,630 | 4/1987 | Miyo | 370/95.3 |
| 4,930,126 | 5/1990 | Kazecki et al. | 370/77 |
| 5,029,162 | 7/1991 | Epps | 370/77 |
| 5,042,082 | 8/1991 | Dahlin | 370/95.1 |

FOREIGN PATENT DOCUMENTS

| | | |
|---|---|---|
| 0192061 | 8/1986 | European Pat. Off. . |
| 0325252 | 7/1989 | European Pat. Off. . |
| 2061744 | 7/1971 | Fed. Rep. of Germany . |

OTHER PUBLICATIONS

Patent Abstracts of Japan, vol. 10, No. 145 (E-407) (2202) 28 May 1986 and JP-A-61 005 610 (Mitsubishi) 11 Jan. 1986.
37th IEEE Vehic. Techn. Conference 1987 (NY) pp. 293-299 Radio Test Performance of a Narrowband TDMA System (Stjernvall et al.) p. 294, line 14–line 18.

Primary Examiner—Douglas W. Olms
Assistant Examiner—Alpus Hsu
Attorney, Agent, or Firm—Leydig, Voit & Mayer

[57] ABSTRACT

A receiver for a mobile telephone system operating in a Time Division Multiple Access (TDMA) system, includes a gain control circuit coupled to receive an input signal, the circuit being switchable under the control of digital control signals between three gain or attenuation levels. An equalizer is coupled to receive the output signal from the gain control circuit. A signal strength unit determines the value of the received signals and provides the digital control signals so as to set the gain or attenuation level constant for a time slot of the TDMA system. The signal strength unit records the determined signal value so as to set the level of said gain control circuit prior to a predetermined time slot based upon measurements made during a preceding time period.

7 Claims, 3 Drawing Sheets

RECEIVER GAIN CONTROL FOR RADIO TELEPHONE SYSTEM

BACKGROUND OF THE INVENTION

This invention relates to receivers. In particular the invention relates to receivers for radio telephone systems which operate in a Time Division Multiple Access (TDMA) system.

With the impending adoption of the GSM (Groupe Speciale Mobile) system for a Pan-European Mobile Telephone System [see for example Electronics and Communication Engineering Journal Jan/Feb. 1989 vol. 1 no. 1 pp 7 to 13, "Pan-European cellular radio", D. M. Balston], a number of difficult technical problems have to be overcome for satisfactory implementation of the system.

In the GSM system, data to be transmitted is modulated on to a 900 MHz carrier signal by a Gaussian minimum shift keying technique (GMSK). Frequency channels are provided at a spacing of 200 KHz and data is transmitted on each channel at a total rate of 270.833 kbits$^{-1}$.

DESCRIPTION OF THE PRIOR ART

FIG. 1 is a schematic view of the TDMA format for the GSM system. Referring to FIG. 1, this shows the basic format of one frequency channel for GSM transmissions as comprising a series of frames (Time Domain Multiple Access Frames), each frame comprising eight multiplexed time slots from different mobile stations. Each frame is 4.615 ms in length, and each time slot 0.577 ms in length. The structure of a time slot as shown comprises two sections of data separated by control bits, tail bits etc. Data is transmitted from each mobile station within a time slot in compressed format equivalent to 13 kbits$^{-1}$.

Given the very tight technical constraints of the GSM system, interference and data loss and corruption can easily occur.

Problems arise in the receiver for the GSM terminal, whether it be a terminal in a mobile station or in a base station. Firstly the strength of the signal received by the terminal will vary and the input dynamic range may be as large as 100 dB. This is because, in the case of a mobile station, it must not only operate in a traffic mode to receive data signals from the adjacent base station, but must also operate in a monitor mode to monitor neighboring base stations during time slots of the frame not reserved for data transmission -for hand over purposes. Hence it is necessary to adjust the gain by very large amounts from time slot to time slot, i.e. within 0.577 ms. Conventional methods of automatic gain control can not cope with such extreme demands. Secondly, received signals at whatever level they are received, must be amplified to a suitable level so that they can be accommodated within the input dynamic range of an analogue to digital (A to D) converter system which follows the intermediate frequency (IF) stage. Since the dynamic range of an A to D converter is relatively small, it is necessary to adjust the gain of the system so that each incoming pulse of RF energy is at an appropriate level. The amplification applied must be constant throughout the slot in order to preserve the amplitude and phase information of the incoming pulses, since the incoming pulses would be highly distorted from the original transmitted signal due to multipath reflections. In order to correct such multipath effects it is necessary to carry out equalization processing on the input signals by means of an equalizer system, and it is therefore necessary to preserve all amplitude and phase information of the incoming pulses.

SUMMARY OF THE INVENTION

In accordance with the invention, a receiver for a mobile telephone system operating in a time division multiple access (TDMA) system, includes a gain control means coupled to receive an input signal, the gain control means being switchable under the control of digital control signals between a plurality of gain and-/or attenuation levels, and means for determining the value of the received signal and providing said digital control signals to set the gain or attenuation level constant for a time slot of the TDMA system, said determining means including means for recording the determined signal value to set the level of said gain control means prior to a predetermined time slot based upon measurements made during a preceding time period.

In one particular receiver in accordance with the invention, when operating in the traffic mode, the signal strength of the incoming signal may be monitored by a logarithmic amplifier which is very fast acting, so that it can detect the incoming signal strength, and provide a signal to an A to D converter which provides digital control signals to a plurality of switched gain amplifiers connected in cascade. By this means the gain is set based upon current information for the time slot immediately prior to the reception of the data for the time slot.

In alternative modes of operation, where for example a mobile station is operating in a monitor mode to monitor a new base station to ascertain whether it is a candidate for hand over, there may be no prior information regarding the signal strength of that particular base station. In a particular receiver in accordance with the invention, the plurality of switched gain amplifiers are selectively actuated by a counter mechanism which increases the gain of the cascaded amplifiers until the amplified signal from that base station lies within the dynamic range of the A to D converter. This fact is detected and the resultant setting of the amplifiers, together with a measurement of the demodulated signal, provides an accurate measurement of received signal strength.

BRIEF DESCRIPTION OF THE DRAWINGS

Two embodiments of the invention will now be described, by way of example only, with reference to the accompanying drawings in which.

DESCRIPTION OF THE PREFERRED EMBODIMENTS

Figure 1:
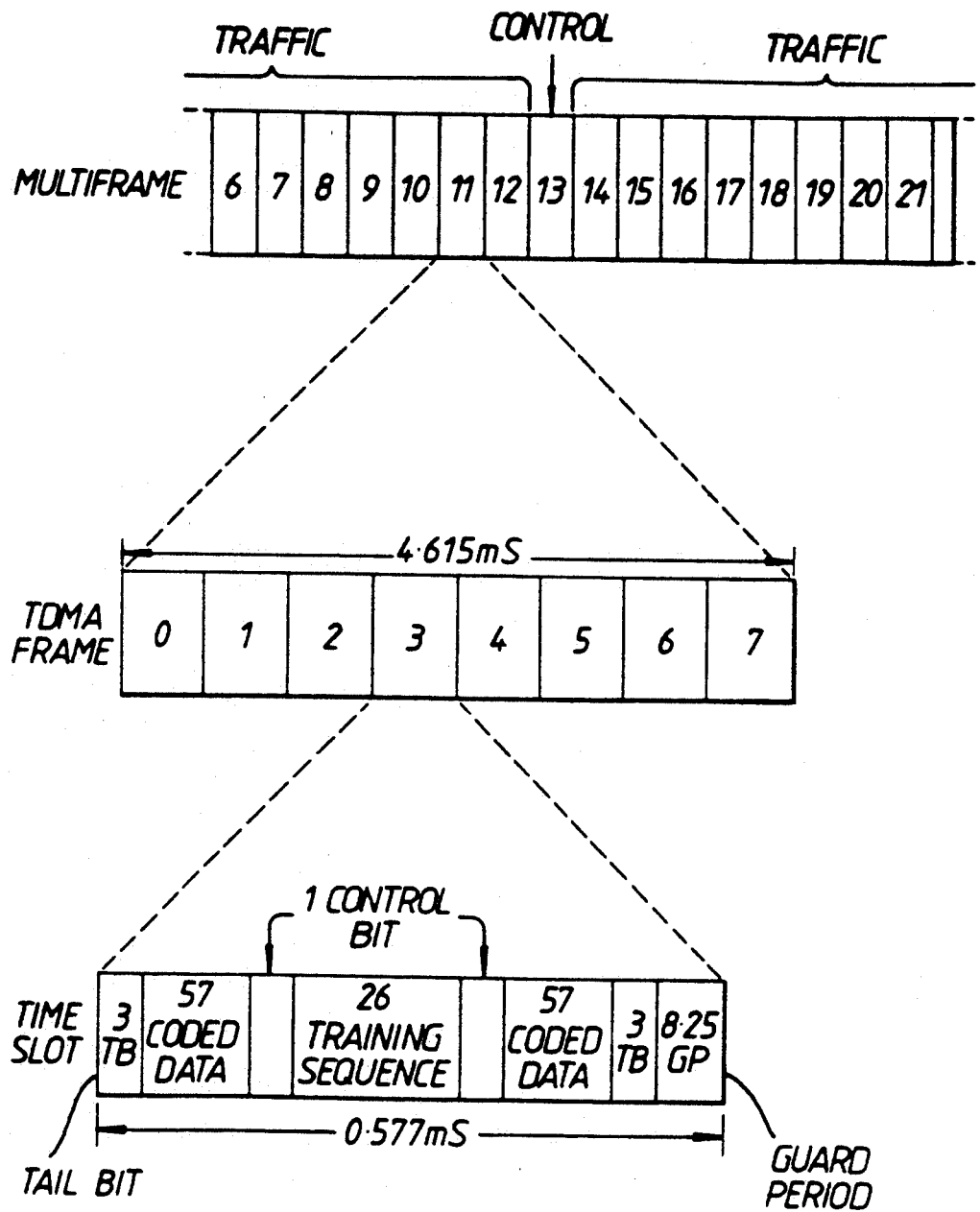
FIG. 1 is a schematic view of the TDMA format for the GSM system as has already been described.
Figure 2:
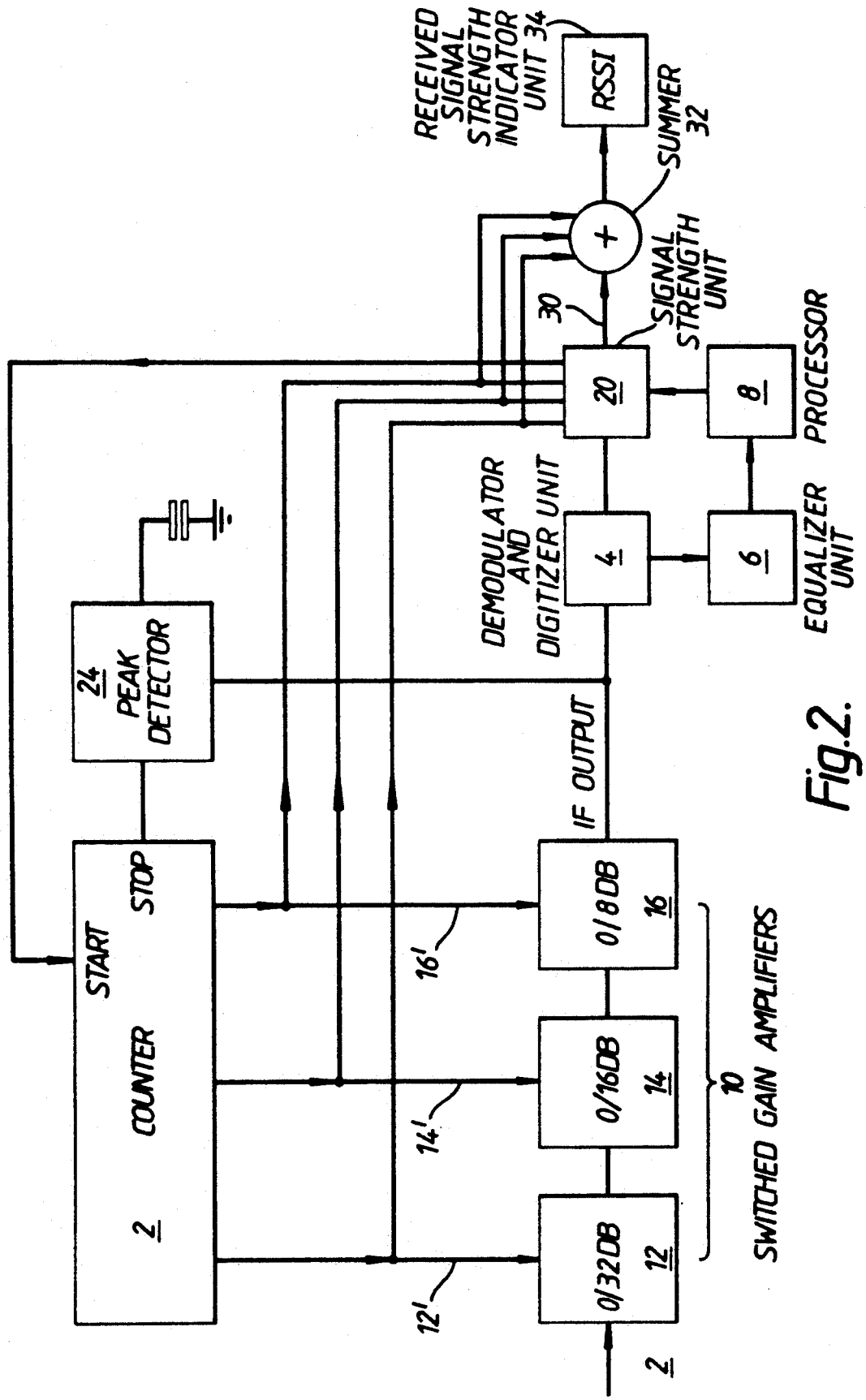
FIG. 2 is a schematic block diagram showing part of a receiver for a GSM terminal according to a first embodiment of the invention.

Referring now to FIG. 2, the receiver, which may be incorporated in either a mobile station or a base station of a GSM system, incorporates suitable signal processing means (not shown) for processing a received signal to provide an IF signal on a line 2. This IF signal is modulated according to a gaussian minimum shift keying technique, and the signal is demodulated and digitized in a demodulator digitizer unit 4, following which the digital signals are equalized at equalization and processing techniques will be well known to those skilled in the art.

IF line 2 is coupled to demodulator and digitizer unit 4 by a cascaded chain 10 of three switched gain amplifiers 12,14 and 16. Control lines 12',14' and 16' are arranged to switch amplifiers 12,14 and 16 respectively between the condition in which they merely pass the signal without amplification (i.e. zero dB gain), and the condition in which amplifier 12 provides 32 dB of gain, amplifier 14 provides 16 dB of gain and amplifier 16 provides 8 dB of gain. Control lines 12',14' and 16' are coupled to a signal strength unit 20 and also to a counter 22. Counter 22 has a start input coupled to signal strength unit 20, and a stop input coupled to a peak detector 24 which is responsive to the IF signal at the input to demodulator and digitizer unit 4. Peak detector 24 responds to say ¼ or ½ of an IF waveform cycle to produce an estimate of signal strength based upon the waveform peak.

Unit 20 provides on an output line 30 a measure of signals strength detected by unit 4. This is summed at a summer 32 with the signals on lines 12',14' and 16' indicating the gain provided by chain 10 in order to provide an indication of received signal strength at received signal strength indicator (RSSI) unit 34.

Thus in operation, where the receiver is operating in a traffic mode and receiving incoming frames of information, containing data representing voice information, then signal strength unit 20, having memorized the signal strength of the IF input signal from preceding time slots, will provide signals on control lines 12',14' and 16' to provide the appropriate amount of gain to the IF signal for the resultant IF signal to be accommodated within the dynamic range of the A to D converter. The total received signal strength is indicated in RSSI unit 34. In the traffic mode it can be assumed that the received signal level will only change slowly over large numbers of time slots. Between these slots the transmitted signals will be intended for other mobile stations, and may be at a completely different level.

During unused time slots of a time frame, the mobile station will monitor base station control channel signals from adjacent base stations. These will be continuous signals of a different frequency to those frequencies used in the traffic mode signals. If the control channel signal of a base station having an unknown control channel signal strength is to be monitored, then counter 22 is actuated at the beginning of the time slot by signal strength unit 20 in order to ramp up the gain provided by the switch gained amplifiers quickly, until the signal strength as detected by peak detector 24 detects that the signal strength is within the dynamic range of the A to D converter system in unit 4 and accordingly stops counter 22. The setting of counter 22 is memorized in unit 20 and is employed for subsequent readings. It will be appreciated that it will be necessary to monitor part of the control signal during at least part of a first time slot to set the gain of the amplifiers 12,14,16 to enable the signal from the base station to be monitored in the subsequent time slot, and demodulated to derive the identity of the base station. As the control channels each have constant carrier amplitude, there is no slot to slot level change as in the traffic mode. The setting of counter 22 also provides a measure of the received signal strength, when combined by summer 32 with the measured amplitude of signals in unit 4 on line 30, to provide an indication of received signal strength in unit 34.

Figure 3:
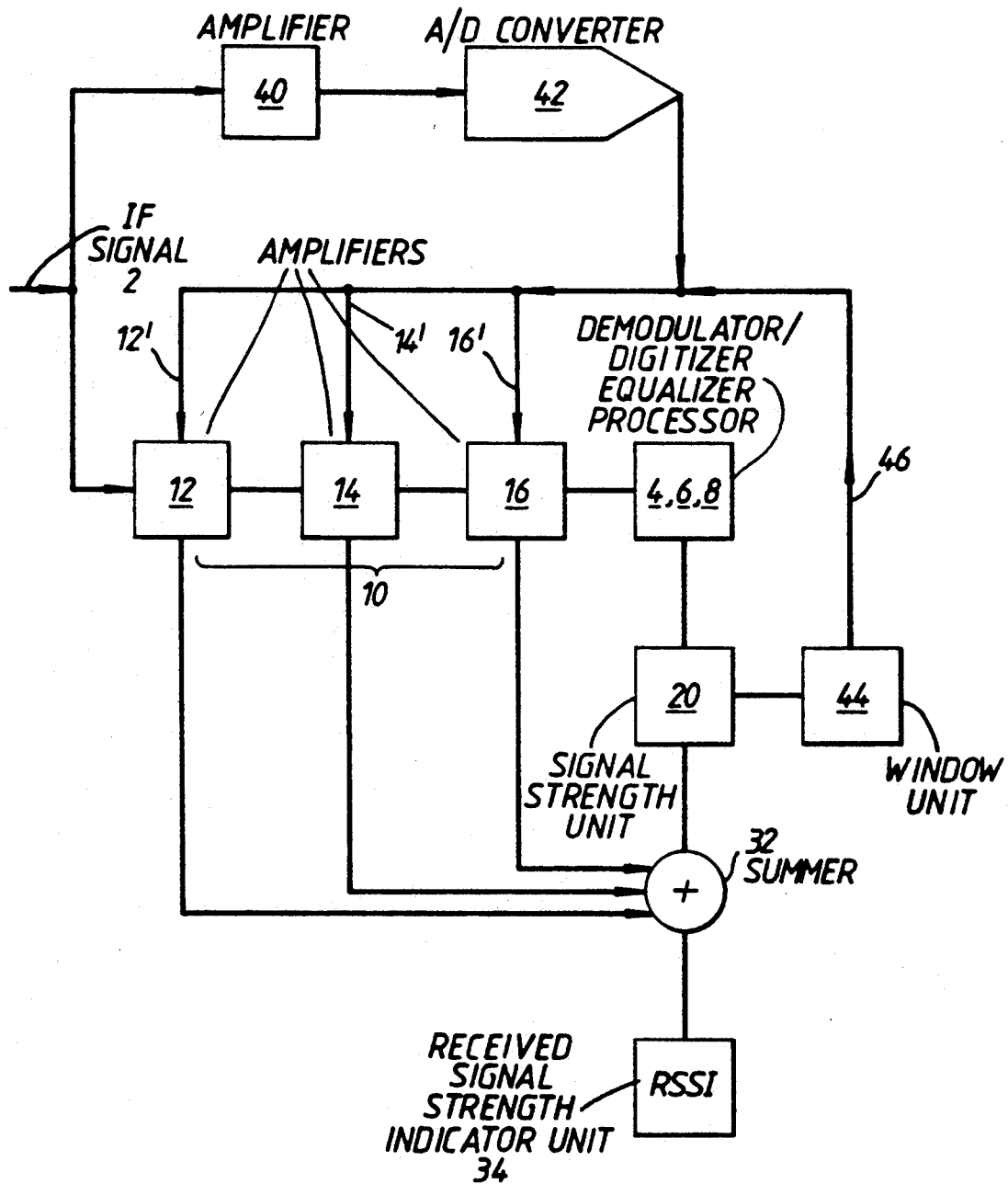
FIG. 3 is a schematic block diagram of part of a receiver for a GSM terminal according to an alternative embodiment of the invention.

In the alternative embodiment shown in FIG. 3, similar parts to those of FIG. 2 are indicated by similar reference numerals. In the receiver shown in FIG. 3, the IF signal is applied to a logarithmic amplifier 40 which is arranged to detect the level of the IF signal. Amplifier 40 does this within a very short space of time and can therefore detect the IF signal strength prior to received data being received at the demodulator and digitizer unit 4. The output of amplifier 40 is converted to a digital value in flash A to D converter 42 and the digital value is fed via control lines 12',14' and 16' to control switched gain amplifiers 12,14 and 16. Thus it is possible to set the gain values of amplifier 12,14 and 16 at the beginning of the time slot. The signal received at unit 4 has its power level measured in signal strength unit 20 and this level is summed in summer 32 together with the gain setting of amplifiers 12,14 and 16 in order to provide an accurate measurement of the received signal strength. If the measured power at signal strength unit 20 is determined to be excessive or insufficient, signals are provided via a window unit 44 to provide further gain control signals on line 46 to lines 12',14' and 16' during a window period occuring within the time slots.

It will be appreciated in each of the embodiments described herebefore, by way of example, the automatic gain control has a relatively coarse 8 dB setting resolution. This allows precise gain setting with a small number of digital control lines, and rapid changes of gain over a wide range. By the use of additional switched gain amplifiers, and corresponding digital control lines, finer resolution may be achieved. A finer automatic gain control is, however, superimposed on the system by use of the equalizer 6. This effectively provides a further two levels of resolution. It will be appreciated however that if, for example, sufficient switched gain amplifier stages are incorporated, it may be possible to omit the equalizer.

What is claimed is:

1. A receiver for a mobile telephone system operating in a time division multiple access (TDMA) system, the receiver being capable of operating alternately in a monitor mode in which the receiver scans for incoming control signals, and a traffic mode in which the receiver receives incoming data signals, the receiver including a gain control means coupled to receive said incoming control signals and said incoming data signals and being switchable under the control of digital control signals between a plurality of gain levels, and determining means for determining the value of the received signal, and providing said digital control signals to set the gain level constant for a time slot of the TDMA system whilst the receiver is operating in said traffic mode, said determining means including recording means for recording the determined signal value and setting the level of said gain control means whilst the receiver is operating in the monitor mode and prior to a predetermined time slot based upon measurements made during a preceding time slot.

2. A receiver as claimed in claim 1 in which the gain control means produced an output signal, the receiver including an equalizer means coupled to receive the output signal from the gain control means.

3. A receiver as claimed in claim 1, wherein the determining means is operative to set the gain level prior to said predetermined time slot based upon measurements made immediately prior to the time slot, the determining means including means for providing the current signal value to control the values of the digital control signals.

4. A receiver as claimed in claim 1, wherein the determining means includes a counter /which increments the value of the digital control signals, and means for detecting a peak value of the input signal to stop operation of the counter.

5. A receiver as claimed in claim 1, wherein the gain control means includes a plurality of switched gain amplifiers connected in cascade, with each amplifier having a gain control line for selecting one of a plurality of gain levels dependent on said digital control signals.

6. A receiver as claimed in claim 1, wherein the determining means includes a logarithmic amplifier for measuring the input signal, coupled to an analogue to digital converter for providing said digital control signals.

7. A receiver as claimed in claim 1 in which the gain control means produces an output signal, including means for demodulating the output signal, means for measuring the strength of the demodulated signal, and means for adding the measured strength to the gain setting of the gain control means to provide an indication of received signal strength.

* * * * *